United States Patent [19]

Shiratsuchi

[11] Patent Number: 5,345,412
[45] Date of Patent: Sep. 6, 1994

[54] MEMORY IC AND MEMORY DEVICE CAPABLE OF EXPANSION OF STORAGE CAPACITY

[75] Inventor: Syuuichi Shiratsuchi, Itami, Japan

[73] Assignee: Mitsubishi Denki Kabushiki Kaisha, Tokyo, Japan

[21] Appl. No.: 914,313

[22] Filed: Jul. 17, 1992

[30] Foreign Application Priority Data

Jul. 19, 1991 [JP] Japan .................... 3-179699
Oct. 29, 1991 [JP] Japan .................... 3-283191

[51] Int. Cl.$^5$ .............................................. G11C 5/06
[52] U.S. Cl. ...................................... 365/63; 365/52; 257/686; 257/696
[58] Field of Search ................ 365/52, 63; 257/686, 257/696, 786

[56] References Cited

U.S. PATENT DOCUMENTS

4,398,235 8/1983 Lutz et al. ..................... 257/686
4,884,237 11/1989 Mueller et al. .................. 365/52

Primary Examiner—Eugene R. LaRoche
Assistant Examiner—Andrew Q. Tran
Attorney, Agent, or Firm—Leydig, Voit & Mayer

[57] ABSTRACT

A memory IC includes a memory element having a chip select signal input terminal and a decoder for decoding a portion of an address input signal to output, from the decoding, a chip select signal from one of a plurality of output terminals. One of the plurality of output terminals is connected to the chip select signal input terminal of said memory element for selecting the memory element for read and write operations. A memory device includes a plurality of memory ICs, each having a memory element, a decoder for decoding a portion of an address input signal to output, from the decoding, a chip select signal from one of a plurality of output terminals, and a plurality of leads connected to the memory element and the decoder. One of the plurality of output terminals is connected to the chip select signal input terminal of the memory element for selecting the memory element for read and write operations. The specific output terminals of the decoders of the respective memory ICs differ from each other.

16 Claims, 6 Drawing Sheets

MEMORY IC AND MEMORY DEVICE CAPABLE OF EXPANSION OF STORAGE CAPACITY

BACKGROUND OF THE INVENTION

1. Field of the Invention

The present invention relates to a memory IC and a memory device and, more particularly, to a memory IC whose memory capacity can be easily expanded and to a memory device whose memory capacity is expanded by connecting a plurality of such memory ICs to it.

2. Description of the Related Art

FIG. 6 shows a conventional memory IC. An address bus 2 composed of address input lines $A_1$ to $A_n$ used for addressing purposes, and a data bus 6 composed of data input/output lines $D_1$ to $D_m$ are connected to a static RAM 1. A write enable line 3 is connected to a write enable input terminal WE of the static RAM 1; a read enable line 4 is connected to a read enable input terminal OE; and a chip select input line 5 is connected to a chip select input terminal S.

When a low-level chip select signal is input through the chip select input line 5, data on the data bus 6 is written into an address specified by the address bus 2 or data which is stored at an address specified by the address bus 2 is supplied to the data bus 6. This writing is based on a low-level write enable signal transmitted through the write enable line 3, and the reading is based on a low-level read enable signal transmitted through the read enable line 4.

FIG. 7 shows the structure of a memory device whose capacity is expanded by employing a plurality of such memory ICs. Address input lines $A_1$ to $A_n$ of an address bus 20, a write enable line 3, a read enable line 4 and a data bus 6 are each connected to all static RAMs 11 to 14, which are of the same type as that of the static RAM 1 shown in FIG. 6. A decoder 21 is connected to a chip select input terminal S of each of the static RAMs 11 to 14. Address input lines $A_{n+1}$ and $A_{n+2}$ from among the address input lines of the address bus 20 are connected to input terminals P1 and P2 of the decoder 21, respectively. A chip enable signal line 22 is connected to a chip enable input terminal CE. Output terminals T1 to T4 of the decoder 21 are connected to chip select input terminals S of the static RAMs 11 to 14, respectively.

Table 1 shows the functions of the decoder 21.

TABLE 1

| Input | | | Output | | | |
|---|---|---|---|---|---|---|
| $A_n + 1$ | $A_n + 2$ | CE | T1 | T2 | T3 | T4 |
| X | X | H | H | H | H | H |
| L | L | L | L | H | H | H |
| H | L | L | H | L | H | H |
| L | H | L | H | H | L | H |
| H | H | L | H | H | H | L | where "X" denotes that signals may be at either a high or a low level.

There are several operational modes of the static RAMs 11 to 14, such as a write mode, a read mode and a standby mode. A description will now be given of the operation of the memory device shown in FIG. 7 when it is in the write mode.

When data is written into the first static RAM 11, first, the address input lines $A_1$ to $A_n$ of the address bus 20 specify an address in the static RAM 11. Then the levels of the address input lines $A_{n+1}$ and $A_{n+2}$ are made low. A low-level chip enable signal is input through the chip enable signal line 22. By the above operation, as shown in Table 1, a low-level signal is output from the output terminal T1 of the decoder 21 to the chip select input terminal S of the static RAM 11, and thus the static RAM 11 is selected. Under such conditions, when a low-level write enable signal is input through the write enable line 3 to the write enable input terminal WE of the static RAM 11, data on the data bus 6 is written into an address in the static RAM 11, which address is specified by the address input lines $A_1$ to $A_n$.

By changing the levels of the address input lines $A_{n+1}$ and $A_{n+2}$, in the same manner as described above, data can be written into the static RAMs 12 to 14, which are second, third and fourth static RAMs, respectively. In other words, as can be seen from Table 1, when data is written into the second static RAM 12, the level of the address line $A_{n+1}$ is made high, whereas the level of the address line $A_{n+2}$ is made low; when data is written into the third static RAM 13, the level of the address line $A_{n+1}$ is made low, whereas the level of the address line $A_{n+2}$ is made high; and when data is written into the fourth static RAM 14, the respective levels of the address lines $A_{n+1}$ and $A_{n+2}$ are made high.

However, when the capacity of a memory device, such as that shown in FIG. 7, is expanded by combining a plurality of conventional memory ICs, a decoder separate from the ICs must be provided and connected to the ICs, thus making the circuit wiring complicated, particularly when, e.g., as many as 16 or 32 memory ICs, are combined.

FIG. 8 shows the outward appearance of a conventional memory IC. A semiconductor chip, on which static RAM circuitry as shown in FIG. 6 is formed, is sealed inside a resin package 7. Leads 8 connected to respective electrodes of the semiconductor chip extend from the resin package 7. When a memory device is constructed by mounting a plurality of such memory ICs, in order to reduce the area where the memory ICs are actually mounted on the substrate 9, it is desirable that at least two memory ICs 10a and 10b be mounted one on top of another on the substrate 9, as shown in FIG. 9. At this time, leads which handle signals, such as address input signals common to both of the memory ICs 10a and 10b, come into contact with each other, and are connected electrically. However, as can be seen from FIG. 9, in order to bring the leads of both the memory ICs 10a and 10b into contact with each other on the substrate 9, the shape of the leads of the upper memory IC 10b must differ from the shape of the leads of the lower memory IC 10a. When it is intended to mount a plurality of memory ICs one on top of another, various types of memory ICs of different lead shapes must be manufactured, thus reducing productivity.

SUMMARY OF THE INVENTION

The present invention has been made to solve the above problems. Accordingly, an object of this invention is to provide a memory IC in which circuitry can be constructed with simple wiring when a plurality of memory ICs are employed to expand memory capacity.

Another object of this invention is to provide a memory device which can be expanded in capacity by connecting a plurality of memory ICs to the device.

In order to achieve the above objects, according to one aspect of this invention, there is provided a memory IC comprising: a memory element having a chip select signal input terminal; and a decoder for decoding a portion of an address input signal so as to output, on the basis of the decoding, a chip select signal from one of a plurality of output terminals, a specific output terminal from among the plurality of output terminals being connected to the chip select signal input terminal of the memory element.

According to another aspect of this invention, there is provided a memory device comprising: a plurality of memory ICs each having a memory element; a decoder for decoding a portion of an address input signal so as to output, on the basis of the decoding, a chip select signal from one of a plurality of output terminals, a specific output terminal from among the plurality of output terminals being connected to the chip select signal input terminal of the memory element; and a plurality of leads connected to the memory element and the decoder, wherein the specific output terminals of the decoders of the respective memory ICs differ from each other, leads corresponding to the respective memory ICs being connected to each other.

DESCRIPTION OF THE PREFERRED EMBODIMENTS

The embodiments of the present invention will be described below with reference to the accompanying drawings.

Figure 1:
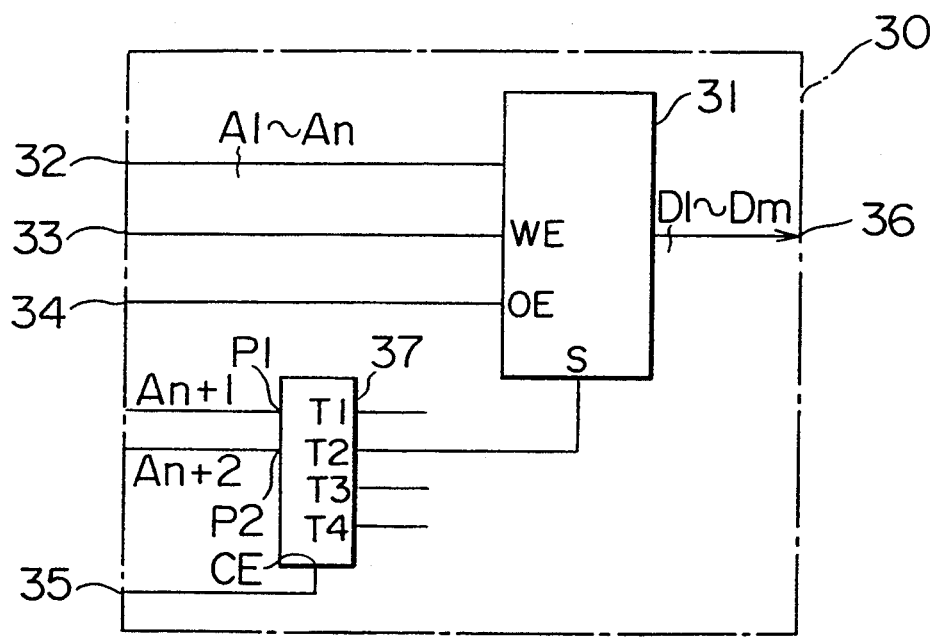
FIG. 1 is a block diagram showing the structure of a memory IC according to an embodiment of the present invention.

In FIG. 1, a memory IC 30 has a static RAM 31 serving as a memory element. An address bus 32 composed of address input lines $A_1$ to $A_n$, and a data bus 36 composed of data input/output lines $D_1$ to $D_m$ are connected to the static RAM 31. A write enable line 33 is connected to a write enable input terminal WE of the static RAM 31, and a read enable line 34 is connected to a read enable input terminal OE of the static RAM 31. A decoder 37 is linked to a chip select input terminal S of the static RAM 31. Address input lines $A_{n+1}$ and $A_{n+2}$ are linked to input terminals P1 and P2 of the decoder 37, respectively. A chip enable signal line 35 is linked to a chip enable input terminal CE. An output terminal T2 of output terminals T1 to T4 is linked to the chip select input terminal S of the static RAM 31.

Figure 7:
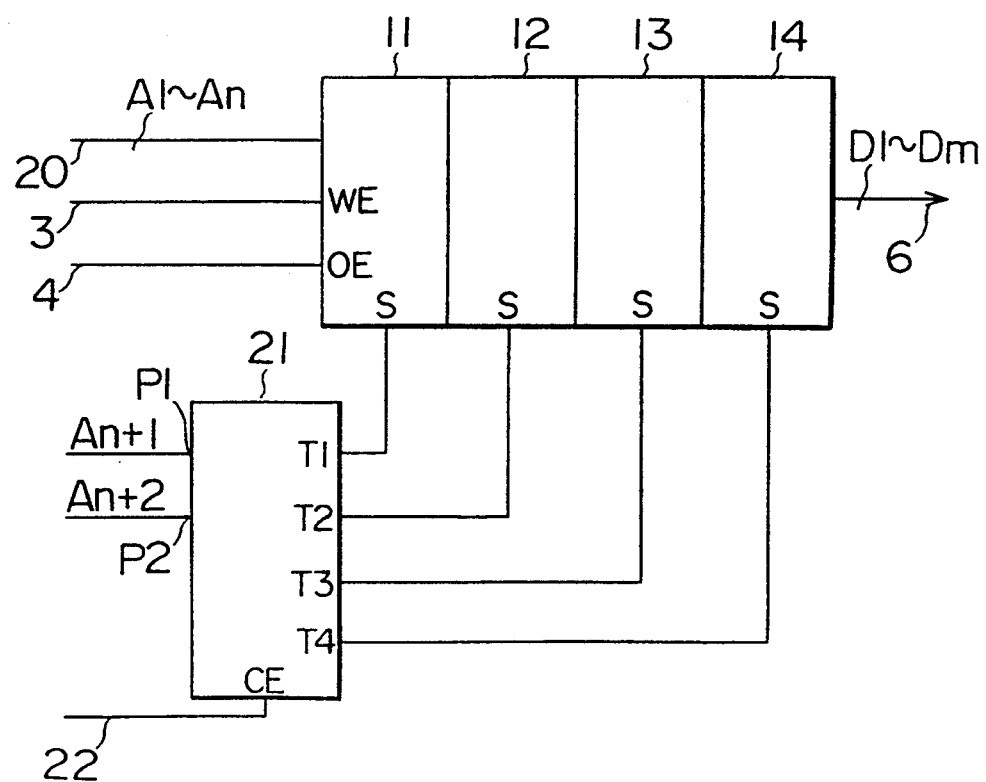
FIG. 7 is a block diagram showing a memory device constructed by combining a plurality of the memory ICs shown in FIG. 6.
Figure 8:
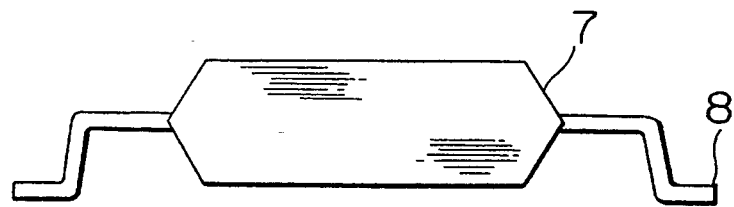
FIG. 8 is a side view showing the outward appearance of the conventional memory IC.
Figure 9:
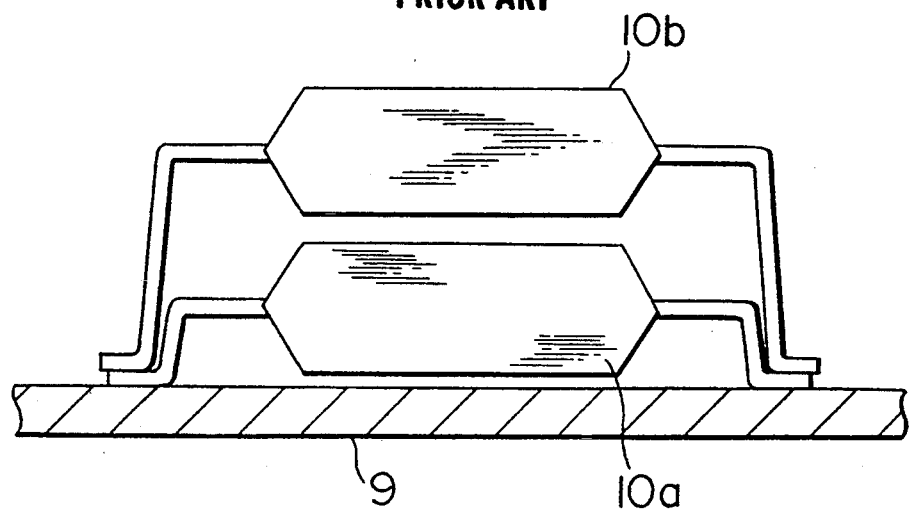
FIG. 9 is a side view showing the outward appearance of a plurality of conventional memory ICs mounted on a substrate.

The decoder 37 has the same input/output characteristics as those of the decoder 21 shown in FIG. 7 and Table 1. A chip select signal is output from the output terminal T2 of the decoder 37 to the chip select input terminal S of the static RAM 31 when the chip enable signal line 35 is at a low level, and when the address input line $A_{n+1}$ is at a high level and the address input line $A_{n+2}$ is at a low level.

The operation of the memory IC 30 will now be described. When the level of the address input line $A_{n+1}$ is made high and the levels of both the address input line $A_{n+2}$ and the chip enable signal line 35 are made low, the chip select signal is output from the output terminal T2 of the decoder 37 to the chip select input terminal S of the static RAM 31, thereby causing the static RAM 31 to be enabled. Under the above conditions, when the address bus 32 specifies an address and a low-level write enable signal is input through the write enable line 33 to the write enable input terminal WE of the static RAM 31, data on the data bus 36 is written into an address specified by the address bus 32. Similarly when, the address bus 32 specifies an address and a low-level read enable signal is input through the read enable line 34 to the read enable input terminal OE of the static RAM 31, data which is stored at an address specified by the address bus 32 is supplied to the data bus 36.

When the level of the chip enable signal line 35 is made high, or except when the levels of the address input lines $A_{n+1}$ and $A_{n+2}$ are made high and low, respectively, the static RAM 31 enters into a standby mode, and the impedance of the data bus 36 increases.

Table 2 shows the functions of the memory IC 30.

TABLE 2

| Mode | Input | | | | | Data bus |
|---|---|---|---|---|---|---|
| | An + 1 | An + 2 | CE | WE | OE | |
| Write | H | L | L | L | X | data input |
| Read | H | L | L | H | L | data output |
| Standby | X | X | H | X | X | high |
| | L | L | X | X | X | impedance |
| | L | H | X | X | X | |
| | H | H | X | X | X | | where "X" denotes that signals may be at either a high or a low level.

Figure 2:
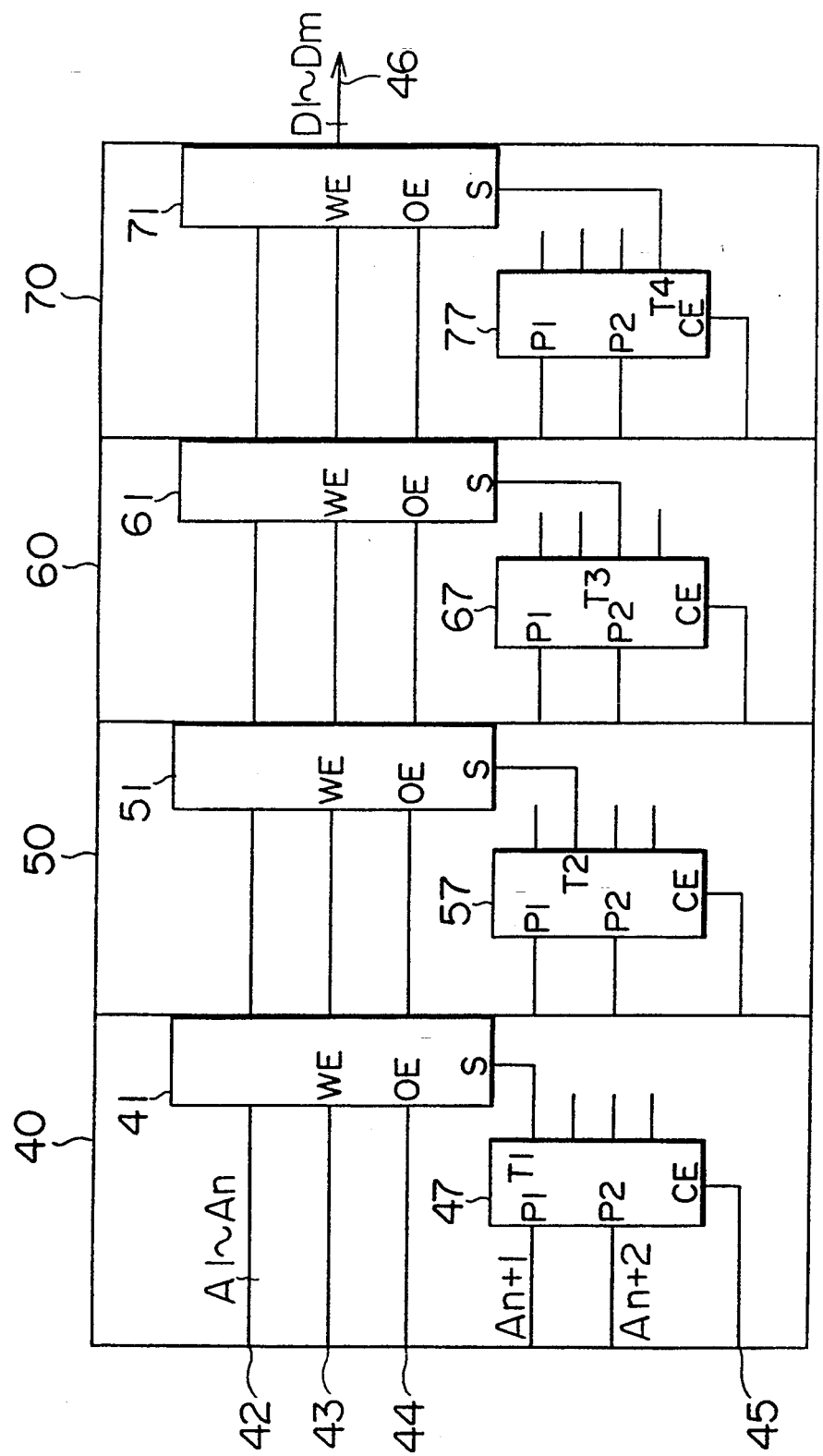
FIG. 2 is a block diagram showing a memory device constructed by combining a plurality of the memory ICs shown in FIG. 1.

FIG. 2 shows the structure of a memory device whose capacity is expanded by using a plurality of such memory ICs. Memory ICs 40, 50, 60 and 70, which are the same type of memory IC 30 as shown in FIG. 1, are combined in the memory device. The memory ICs 40, 50, 60 and 70 have static RAMs 41, 51, 61 and 71, and decoders 47, 57, 67 and 77, respectively. In the memory IC 40 an output terminal T1 of the decoder 47 is connected to a chip select input terminal S of the static RAM 41; in the memory IC 50 an output terminal T2 of the decoder 57 is connected to a chip select input terminal S of the static RAM 51; in the memory IC 60 an output terminal T3 of the decoder 67 is connected to a chip select input terminal S of the static RAM 61; and in the memory IC 70 an output terminal T4 of the decoder 77 is connected to a chip select input terminal S of the static RAM 71.

An address bus 42, a write enable line 43, a read enable line 44 and a data bus 46, all of which are used commonly, are linked to the static RAMs 41, 51, 61 and 71 of the memory ICs 40, 50, 60 and 70, respectively. Common address input lines $A_{n+1}$ and $A_{n+2}$ are linked to input terminals P1 and P2 of each of the decoders 47, 57, 67 and 77. A common chip enable signal line 45 is linked to a chip enable input terminal CE of each of the decoders 47, 57, 67 and 77.

A description will now be given of the operation of the memory device shown in FIG. 2 when it is in a write mode. When data is written into the first static RAM 41, first, address input lines $A_1$ to $A_n$ of the address bus 42 specify an address in the first static RAM 41. Then, the respective levels of address input lines $A_{n+1}$ and $A_{n+2}$ are made low, and a low-level chip enable signal is input through the chip enable signal line 45. Thereby a low-level signal is output from the output terminal T1 of the decoder 47 to the chip select input terminal S of the static RAM 41. Under such conditions, when a low-level write enable signal is input through the write enable signal line 43 to the write enable input terminal WE of the static RAM 41, data on the data bus 46 is written into an address of the static RAM 41 which is specified by the address input lines $A_1$ to $A_n$.

By changing the respective levels of the address input lines $A_{n+1}$ and $A_{n+2}$, in the same manner as described above, data can be written into the static RAMs 51, 61 and 71, which are second, third and fourth static RAMs, respectively. In other words, when data is written into the second static RAM 51, the level of the address line $A_{n+1}$ is made high, whereas the level of the address line $A_{n+2}$ is made low; when data is written into the third static RAM 61, the level of the address line $A_{n+1}$ is made low, whereas the level of the address line $A_{n+2}$ is made high; and when data is written into the fourth static RAM 71, the respective levels of the address lines $A_{n+1}$ and $A_{n+2}$ are made high.

Thus when a plurality of memory ICs according to this embodiment are combined to expand the capacity of a memory device, since each memory IC has a built-in decoder, it is not necessary to provide additional decoders used for selecting all memory ICs. Thus an advantage can be obtained in which simple circuit wiring suffices.

Figure 3:
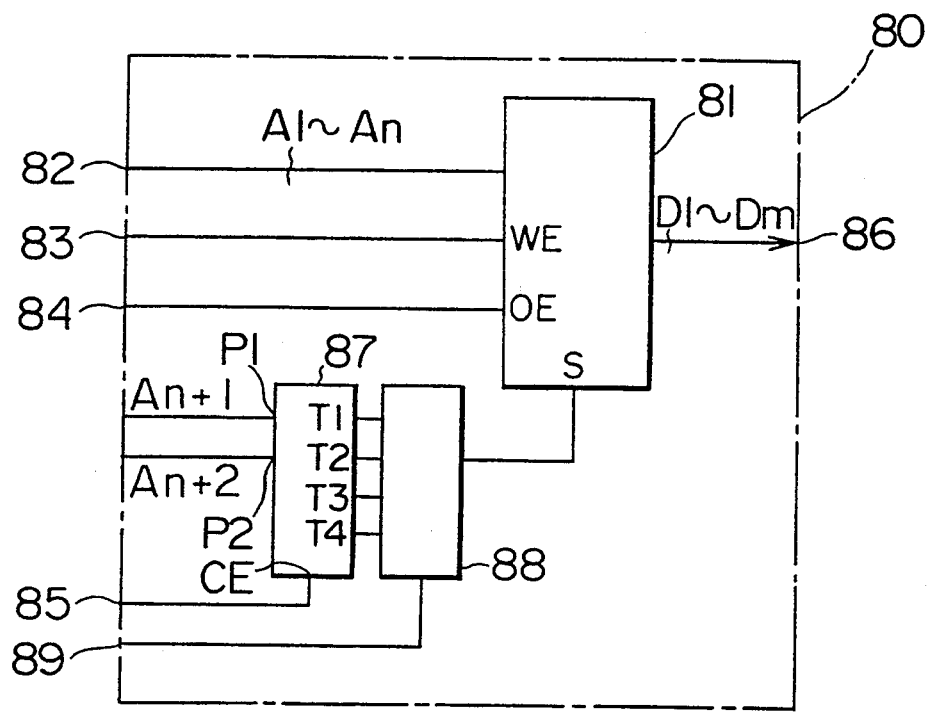
FIG. 3 is a block diagram showing the structure of a memory IC according to another embodiment of this invention.

FIG. 3 shows the inner structure of a memory IC 80 according to another embodiment of this invention. The memory IC 80 has a static RAM 81 and a decoder 87, both of which are same types of RAM and decoder as the static RAM 31 and the decoder 37 of the memory IC 30 shown in FIG. 1. An address bus 82, a write enable line 83, a read enable line 84 and a data bus 86 are all connected to the static RAM 81. Address input lines $A_{n+1}$ and $A_{n+2}$, and a chip enable signal line 85 are connected to the decoder 87.

A fuse ROM 88 serving as selecting means is connected between output terminals T1 to T4 of the decoder 87 and a chip select input terminal S of the static RAM 81. A bundle of control lines 89 is connected to the fuse ROM 88. By applying selectively a voltage or an electric current to a control line from among the bundle of control lines 89, any one of the output terminals T1 to T4 of the decoder 87 can be connected to the chip select input terminal S of the static RAM 81. In other words, first the memory IC 80 is manufactured regardless of which output terminal of the decoder 87 is connected to the chip select input terminal S of the static RAM 81. Then, the bundle of the control lines 89 of the memory IC 80 is used to select an output terminal of the decoder 87. This selection creates the same types of memory ICs as the four types of memory ICs 40, 50, 60 and 70. The created types of memory ICs can be combined together to expand the capacity of a memory device.

Figure 4:
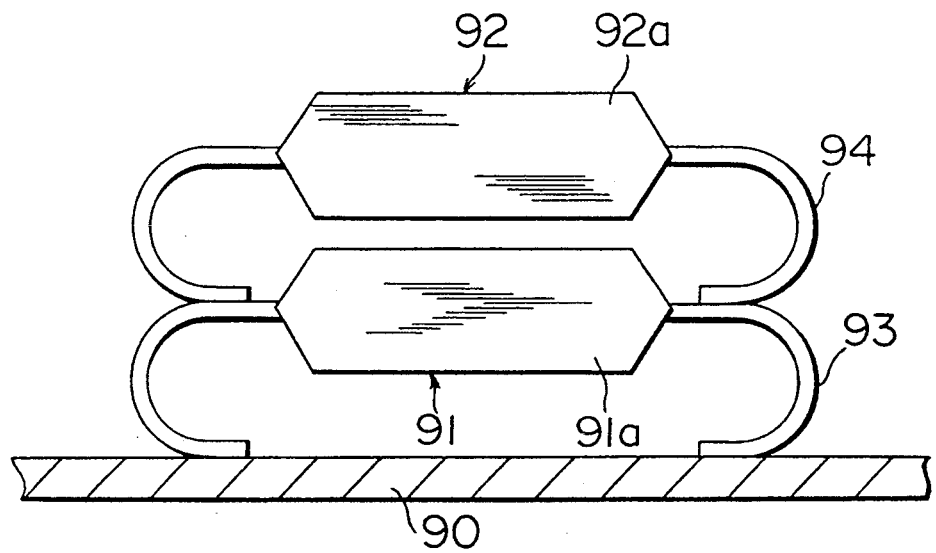
FIG. 4 is a side view showing the outward appearance of a memory device according to an embodiment of this invention.

FIG. 4 shows the outward appearance of a memory device which is constructed by combining a plurality of memory ICs according to this invention. Memory ICs 91 and 92 are mounted on a substrate 90 one on top of the other. The memory ICs 91 and 92 have resin packages 91a and 92a respectively, and a plurality of leads 93 and 94 extending outwardly. An IC chip (not shown) having circuitry shown in FIG. 1 or 3 is sealed inside each of the resin packages 91a and 92a. The plurality of leads 93 and 94 connected to the IC chips extend from the sides of the resin packages 91a and 92a and curve sharply and inwardly toward the undersurfaces thereof. For this reason, when the memory ICs 91 and 92 are mounted on the substrate 90 one on top of the other, the ends of the leads 93 of the memory IC 91 come into contact with the obverse surface of the substrate 90, whereas the ends of the leads 94 of the memory IC 92 come into contact with the originating portions of the leads 93 of the memory IC 91. The memory ICs 91 and 92 can be easily mounted on the substrate 90 by joining the ends of the leads 93 of the memory IC 91 to a wiring pattern on the substrate 90, and by joining the originating portions of the leads 93 of the memory IC 91 to the ends of the leads 94 of the memory IC 92. Solder or the like is used for such joints.

It is possible to mount three or more memory ICs easily in the same way as described above. It is also possible to mount memory ICs side by side on the substrate 90.

Figure 5:
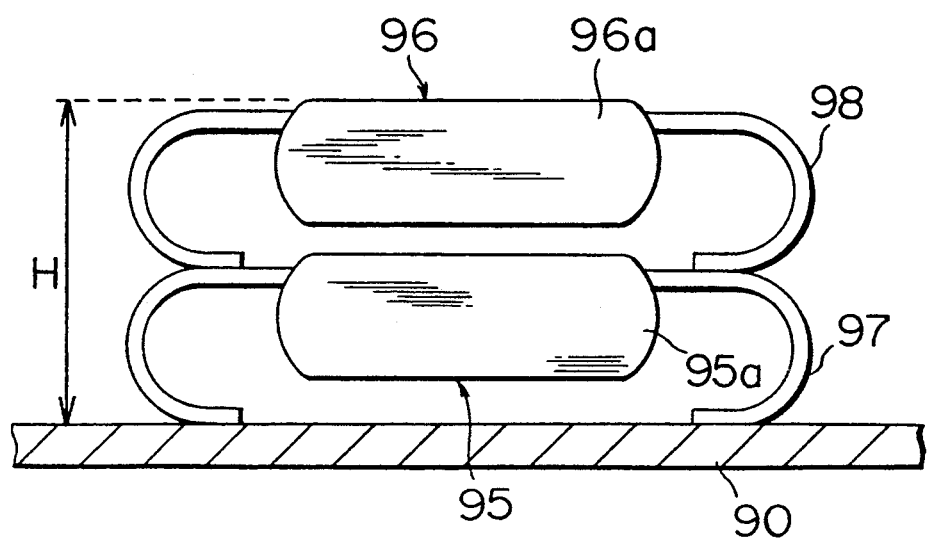
FIG. 5 is a side view showing the outward appearance of a memory device according to another embodiment of this invention.
Figure 6:
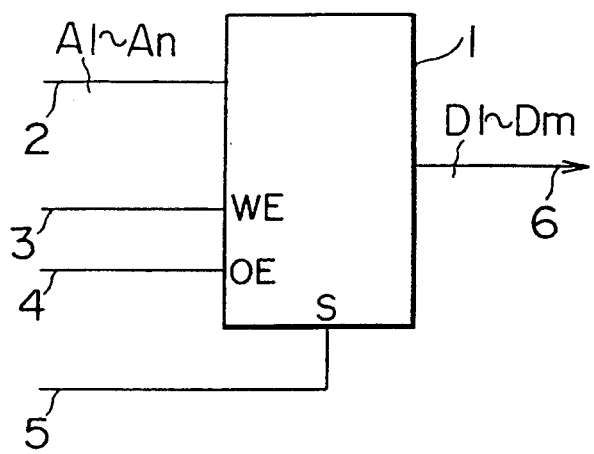
FIG. 6 is a view showing a conventional memory IC.

In the memory ICs 91 and 92 shown in FIG. 4, the leads 93 and 94 extend from the centers of the thick portions of the resin packages 91a and 92a. However, memory ICs 95 and 96 may also be employed in which, as shown in FIG. 5, leads 97 and 98 extend from the packages closer to the obverse surfaces of packages 95a and 96a than to the centers thereof. When a plurality of such memory ICs are mounted on a substrate 90 on top of each other, it is possible to decrease the height H of the memory ICs on the substrate 90, and therefore make the memory device more compact.

What is claimed is:

1. A memory IC comprising:
    a memory element having a chip select signal input terminal;
    a decoder having a plurality of input and output terminals, one of the output terminals being connected to the chip select signal input terminal of the memory element, for decoding a portion of an address signal applied to said input terminals to output, as a result of the decoding, a chip select signal at one of the plurality of output terminals; and
    selecting means connected to the plurality of output terminals of said decoder for selecting, in response to an external signal, one of the output terminals of said decoder and connecting the selected output terminal to the chip select signal input terminal of said memory element.

2. A memory IC as claimed in claim 1 wherein said selecting means is a fuse ROM.

3. A memory IC as claimed in claim 1 wherein each of said memory elements includes a plurality of leads for mounting on top of a stack of similar memory elements with each lead of said memory element contacting a corresponding lead of an adjacent memory element in the stack.

4. A memory device comprising:

a plurality of memory ICs, each memory IC including:
- a memory element having a chip select signal input terminal;
- a decoder having a plurality of input terminals and output terminals for decoding a portion of an address signal applied to the input terminals to output on a specific output terminal, as a result of the decoding, a chip select signal for enabling the memory element, the specific output terminal being connected to a chip select input terminal of the memory element, and
- a plurality of leads connected to the memory element and to the decoder wherein the particular output terminal of each decoder connected to a respective memory IC differs from memory IC to memory IC.

5. A memory device as claimed in claim 4 wherein the plurality of memory ICs are mounted on top of each other in a stack.

6. A memory device as claimed in claim 4 wherein each of the memory ICs includes a package and a plurality of leads extending from the package, the leads being substantially identical to and contacting corresponding leads of an adjacent memory IC in a stack.

7. A memory device as claimed in claim 6 wherein the plurality of leads of each memory IC have ends and the leads are bent in a U-shape, the ends of the plurality of leads of one of the memory ICs contacting corresponding leads of an adjacent memory IC in the stack.

8. A memory device as claimed in claim 6 wherein each package has a first surface and an opposed second surface and side surfaces joining the first and second surfaces, the plurality of leads extending from the side surfaces of the package near the first surface, the leads having ends near the second surface.

9. A memory device comprising:
at least one integrated circuit including:
- a plurality of input terminals for receiving an address signal,
- a memory element having a plurality of memory locations for storing data in and for supplying stored data from respective memory locations in response to respective enable signals,
- a decoder having an input coupled to some of the plurality of input terminals and a plurality of output terminals coupled to the memory element for decoding a portion of the address signal applied to the input terminals to produce an enable signal applied to the memory element wherein at least one of the address signals applied to the plurality of input terminals produces an enable signal to which the memory element is not responsive; and
- selecting means connected to the plurality of output terminals of the decoder for selecting, in response to an external signal, one of the output terminals of the decoder and for connecting the selected output terminal to the memory element to enable the memory element.

10. A memory device as claimed in claim 9 wherein the selecting means is a fuse ROM.

11. A memory device as claimed in claim 9 including a plurality of the integrated circuits sequentially mounted in a stack, each integrated circuit including a plurality of leads, each lead of at least one integrated circuit in the stack contacting a corresponding lead of an adjacent integrated circuit in the stack.

12. A memory device as claimed in claim 9 including a plurality of the integrated circuits wherein the at least one address signal received from the plurality of input terminals that does not enable access to any of the memory locations within each of the integrated circuits is different for each of the plurality of memory ICs in the memory arrangement.

13. A memory device as claimed in claim 12 wherein the plurality of integrated circuits are mounted sequentially in a stack.

14. A memory device as claimed in claim 11 wherein each of the integrated circuits includes a package and the plurality of leads of each integrated circuit are bent in a U-shape.

15. A memory device as claimed in claim 14 wherein each package has a first surface and an opposed second surface and side surfaces joining the first and second surfaces, the plurality of leads extending from the side surfaces of the package near the first surface, the leads having ends near the second surface.

16. A memory device as claimed in claim 9 including an external chip select input terminal for receiving a decoder signal for enabling the decoder.

* * * * *